United States Patent
Song et al.

(10) Patent No.: US 8,552,521 B2
(45) Date of Patent: Oct. 8, 2013

(54) SEMICONDUCTOR PACKAGE TO REMOVE POWER NOISE USING GROUND IMPEDANCE

(75) Inventors: Eun-seok Song, Hwaseong-si (KR); Hee-seok Lee, Yongin-si (KR); Sung-woo Park, Bucheon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 754 days.

(21) Appl. No.: 12/639,228

(22) Filed: Dec. 16, 2009

(65) Prior Publication Data

US 2010/0258905 A1 Oct. 14, 2010

(30) Foreign Application Priority Data

Apr. 10, 2009 (KR) .......................... 10-2009-0031430

(51) Int. Cl.
*H01L 29/00* (2006.01)

(52) U.S. Cl.
USPC ............ 257/500; 257/207; 257/208; 257/532

(58) Field of Classification Search
USPC .......................... 257/532, 207, 208, 500, 693
See application file for complete search history.

(56) References Cited

U.S. PATENT DOCUMENTS

2005/0156277 A1* 7/2005 Nakano et al. ................ 257/532
2009/0080135 A1* 3/2009 Major ........................... 361/220

FOREIGN PATENT DOCUMENTS

| JP | 06204629 | 7/1994 |
| JP | 09199818 | 7/1997 |
| KR | 100817070 | 3/2008 |

* cited by examiner

*Primary Examiner* — Marcos D. Pizarro
*Assistant Examiner* — Tifney L. Skyles
(74) *Attorney, Agent, or Firm* — Stanzione & Kim, LLP (57) ABSTRACT

A semiconductor package removes power noise by using a ground impedance. The semiconductor package includes an analog circuit block, a digital circuit block, an analog ground impedance structure, a digital ground impedance structure, and an integrated ground. The integrated ground and the analog circuit block are electrically connected via the analog ground impedance structure, and the integrated ground and the digital circuit block are electrically connected via the digital ground impedance structure, and an inductance of the analog ground impedance structure is greater than an inductance of the digital ground impedance structure.

21 Claims, 11 Drawing Sheets

SEMICONDUCTOR PACKAGE TO REMOVE POWER NOISE USING GROUND IMPEDANCE

CROSS-REFERENCE TO RELATED APPLICATIONS

This application claims the benefit of Korean Patent Application No. 10-2009-0031430, filed on Apr. 10, 2009 in the Korean Intellectual Property Office, the disclosure of which is incorporated by reference herein in its entirety.

BACKGROUND

1. Field of the Invention

The general inventive concept relates to a semiconductor package, and more particularly, to a semiconductor package in which an analog circuit block and a digital circuit block are formed in combination.

2. Description of the Related Art

With recent increases in integration of semiconductor devices, semiconductor packages are being developed that include an analog circuit block and a digital circuit block. These semiconductor packages include a plurality of circuit blocks formed on one substrate, including a plurality of analog circuit blocks and digital circuit blocks are formed in combination. For example, analog circuits may include op-amps, sensors, power supplies, or power-management circuits, and digital circuits may include memory, logic circuits, and multiplexers.

Accordingly, analog signals and digital signals may exist together in a semiconductor package, and high frequency components generated by the digital signals are transmitted to a power source and a ground of the analog circuit blocks. The high frequency components, however, generate significant noise in the analog circuit blocks.

SUMMARY

To prevent high frequency noise, separation of a ground of the analog circuit blocks and a ground of the digital circuit blocks on a circuit substrate has been suggested. However, when an analog ground and a digital ground are separated from each other and are connected to a system board-level ground and a chipset-level ground, respectively, the number of package ground balls may be increased, and this may consequently increase the size of a semiconductor package.

Also, when the analog ground and the digital ground are separated as described above, a ground may not be provided stably, and thus a return current path may become long and loop inductance may be increased. Consequently, power integrity characteristics of a system may increase, thereby decreasing the performance and stability of the system.

Meanwhile, when the analog grounds and digital grounds are integrated, noise coupling between the analog ground and the digital ground described above may occur. To solve this problem, noise is removed from the system board and the chipset. However, as the clock speed of semiconductor devices increases, noise also needs to be removed from the semiconductor package.

The general inventive concept provides a semiconductor package with a reduced number of package ground balls by integrating grounds, thereby reducing the size of the semiconductor package, wherein the grounds are stably provided and thus power integrity of a system is ensured, and noise between analog grounds and digital grounds is removed.

Additional aspects and utilities of the present general inventive concept will be set forth in part in the description which follows and, in part, will be obvious from the description, or may be learned by practice of the general inventive concept.

Features and/or utilities of the present general inventive concept may be realized by a semiconductor package. The semiconductor package may include an analog circuit block, a digital circuit block, an analog ground impedance, a digital ground impedance, and an integrated ground. The integrated ground and the analog circuit block may be electrically connected via the analog ground impedance. The integrated ground and the digital circuit block may be electrically connected via the digital ground impedance, and an inductance of the analog ground impedance may be greater than an inductance of the digital ground impedance.

The inductance of the analog ground impedance may be at least twice as great as the inductance of the digital ground impedance.

At least one of the group consisting of the analog ground impedance and the digital ground impedance may include metal wirings in the forms of a meandering wire, a single loop, a saw tooth, or a spiral.

At least one of the group consisting of the analog ground impedance and the digital ground impedance may be formed on the same level as the integrated ground layer.

The semiconductor package may further comprise at least one capacitor, wherein an end portion of the at least one capacitor is connected to the analog circuit block and the other end portion of the at least one capacitor is connected to the integrated ground layer.

The at least one capacitor may be an embedded thin capacitor.

Each of the analog circuit block and the digital circuit block may be located on an upper-most layer of a substrate, and each of the analog impedance structure, the digital impedance structure, the integrated ground, and the at least one capacitor may be embedded within the substrate.

At least one of the analog impedance structure and the digital impedance structure may be located on an upper-most surface of a substrate, and the integrated ground may be located on a surface of the substrate opposite the upper-most surface.

Each of the analog circuit block and the digital circuit block may be connected to the integrated ground by at least one via through the substrate.

The at least one via may include a first via to connect the at least one analog circuit to the integrated ground and a second via to connect the at least one digital circuit block to the integrated ground.

The analog circuit block and the digital circuit block are both connected to the same at least one via to connect to the integrated ground.

At least one of the analog impedance structure and the digital impedance structure may be located on the upper-most surface between the respective analog circuit block and digital circuit block and the at least one via.

At least one of the analog impedance structure and the digital impedance structure may be located on the surface of the substrate opposite the upper-most surface.

At least one of the analog circuit block and the digital circuit block may be located on an upper-most surface of a substrate, at least one of the analog impedance structure and the digital impedance structure may be located in a layer within the substrate, and the integrated ground is located on a surface of the substrate opposite the upper-most surface.

Features and/or utilities of the present general inventive concept may also be realized by a semiconductor package. The semiconductor package may comprise at least one analog semiconductor chip including a first chip pad, at least one digital semiconductor chip including a second chip pad, a first conductive medium, a second conductive medium, an analog ground impedance, a digital ground impedance, and an integrated ground layer. The first chip pad and the analog ground impedance may be electrically connected via the first conductive medium, and the second chip pad and the digital ground impedance may be electrically connected via the second conductive medium, and the integrated ground layer and the first conductive medium may be electrically connected via the analog ground impedance, and the integrated ground layer and the second conductive medium may be electrically connected via the digital ground impedance, and an inductance of the analog ground impedance may be greater than an inductance of the digital ground impedance.

The first and second conductive media may be a conductive wire, a solder bump, or a gold (Au) stud bump.

Features and/or utilities of the present general inventive concept may also be realized by a semiconductor package including at least one analog semiconductor chip including a first chip pad, at least one digital semiconductor chip including a second chip pad, a first conductive wire, a second conductive wire, and an integrated ground layer. The integrated ground layer and the first chip pad may be electrically connected via the first conductive wire, and the integrated ground layer and the second chip pad may be electrically connected via the second conductive wire, and the length of the first conductive wire is longer than the length of the second conductive wire.

The inductance of the first conductive wire may be at least twice as great as the inductance of the second conductive wire.

Features and/or utilities of the present general inventive concept may also be realized by a computing device including a semiconductor package and a controller. The semiconductor package may include an analog circuit block, a digital circuit block, an integrated ground connected to each of the analog circuit block and the digital circuit block, a first impedance structure located along an electrical path between the digital circuit block and the integrated ground, and a second impedance structure located along an electrical path between the analog circuit block and the integrated ground, the second impedance structure having an inductance greater than the first impedance structure. The controller may control operation of the analog circuit block and the digital circuit block.

BRIEF DESCRIPTION OF THE DRAWINGS

Exemplary embodiments of the present general inventive concept will be more clearly understood from the following detailed description taken in conjunction with the accompanying drawings in which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Detailed illustrative example embodiments are disclosed herein. However, specific structural and functional details disclosed herein are merely representative for purposes of describing example embodiments. This general inventive concept may, however, may be embodied in many alternate forms and should not be construed as limited to only the example embodiments set forth herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the present description, terms such as 'first', 'second', etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without the teaching of the general inventive concept.

In the drawings, the illustrated features may be changed due to, for example, a manufacturing technology and/or tolerance. Accordingly, it should be understood that the example embodiments of the general inventive concept are not limited to the drawings but include obvious variants and modifications of the features of elements.

Figure 1:
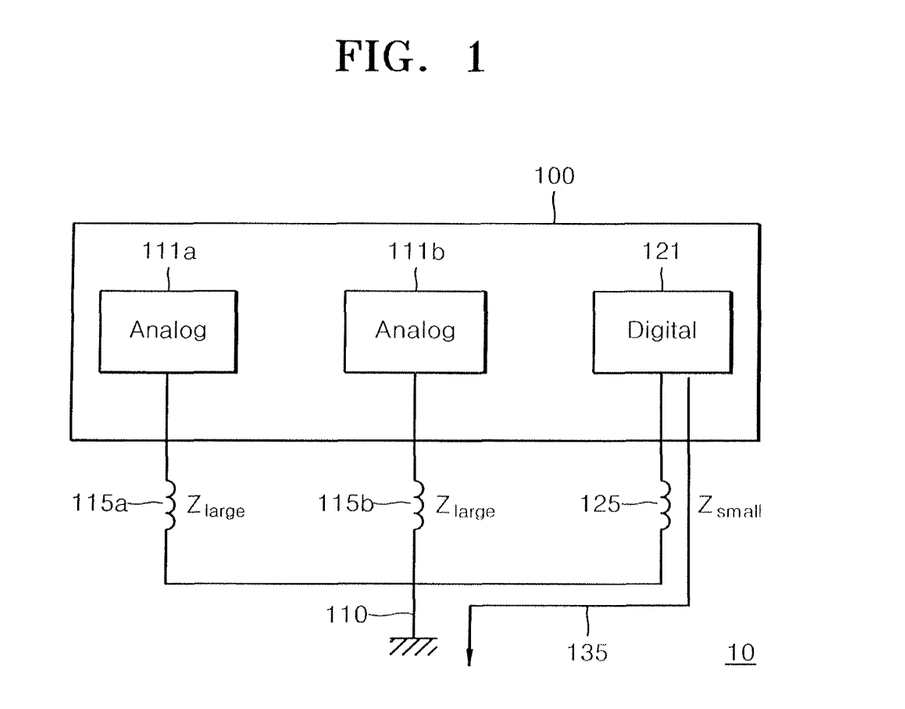
FIG. 1 is a circuit diagram illustrating a semiconductor package according to an embodiment of the general inventive concept.

FIG. 1 is a circuit diagram of a semiconductor package 10 according to an embodiment of the general inventive concept.

In FIG. 1, analog circuit blocks and a digital circuit block formed on a circuit substrate are schematically illustrated. The analog circuit blocks and the digital circuit block may be formed together on one semiconductor chip or separately on an analog semiconductor chip and a digital semiconductor chip, respectively. Also, the analog and digital circuit blocks may include a semiconductor chip including a chip pad and a wiring pattern that is formed on a circuit substrate and is electrically connected to the chip pad.

Referring to FIG. 1, the semiconductor package 10 includes at least one semiconductor chip (not shown), and a circuit substrate 100 on which the semiconductor chip is mounted and a plurality of circuit blocks are formed. The plurality of circuit blocks are formed on the circuit substrate 100 together. In FIG. 1, for example, two analog circuit blocks 111a and 111b and one digital circuit block 121 are illustrated. The circuit substrate 100 may be an analog/digital mixed signal chip package substrate, a system in package (SIP) substrate, a multi-stacked package (MSP) substrate, a wafer level package (WLP) substrate, a flip chip package substrate, or a package-level printed circuit board (PCB).

The analog circuit blocks 111a and 111b are respectively connected to an integrated ground 110 via analog ground impedances, or impedance structures, 115a and 115b, and the digital circuit block 121 is connected to the integrated ground 110 via a digital ground impedance 125. The digital ground impedance 125 is designed to have low inductance, and the analog ground impedances 115a and 115b are designed to have high inductances. The integrated ground 110 is formed on the circuit substrate 110 and provides one equipotential voltage. Accordingly, the integrated ground 110 may provide an equipotential voltage by being formed as a point at which various metal wirings meet or as an integrated ground layer on the circuit substrate 100.

The inductance of the analog ground impedances 115a and 115b may selectively be designed to be at least twice as great as that of the digital ground impedance 125. A wiring pattern 15 illustrated in FIG. 2 may be used to increase the inductance of the analog ground impedances 115a and 115b.

If high frequency noise is generated in the digital circuit block 121, a current path is formed among the analog circuit blocks 111a and 111b and the integrated ground 110. Current does not flow on a path where impedance is relatively high, and thus a high frequency noise current of the digital circuit block 121 is not transmitted to the analog circuit blocks 111a and 111b but flows in a direction 135 toward the integrated ground 110. Accordingly, noise coupling between the analog circuit blocks 111a and 111b and the digital circuit block 121 may be prevented without separating grounds of the analog circuit blocks 111a and 111b and the digital circuit block 121.

Figure 2:
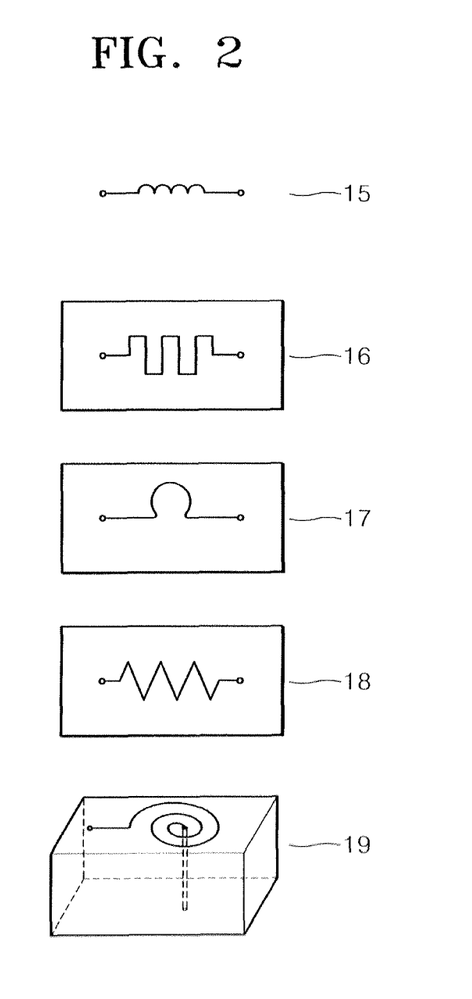
FIG. 2 illustrates a wiring pattern that increases inductance of a ground impedance.

FIG. 2 illustrates a wiring pattern 15 that increases inductance of a ground impedance, according to an embodiment of the general inventive concept.

Referring to FIG. 2, inductance of a ground impedance may be increased by increasing the length of a wiring on a circuit substrate. The wiring pattern 15 may be implemented as a shape of a meandering wire 16, a single loop 17, a saw-toothed shape 18, or a spiral 19. By lengthening a wiring, a magnetic field formed on the wiring is increased, thereby increasing inductance.

Figure 3:
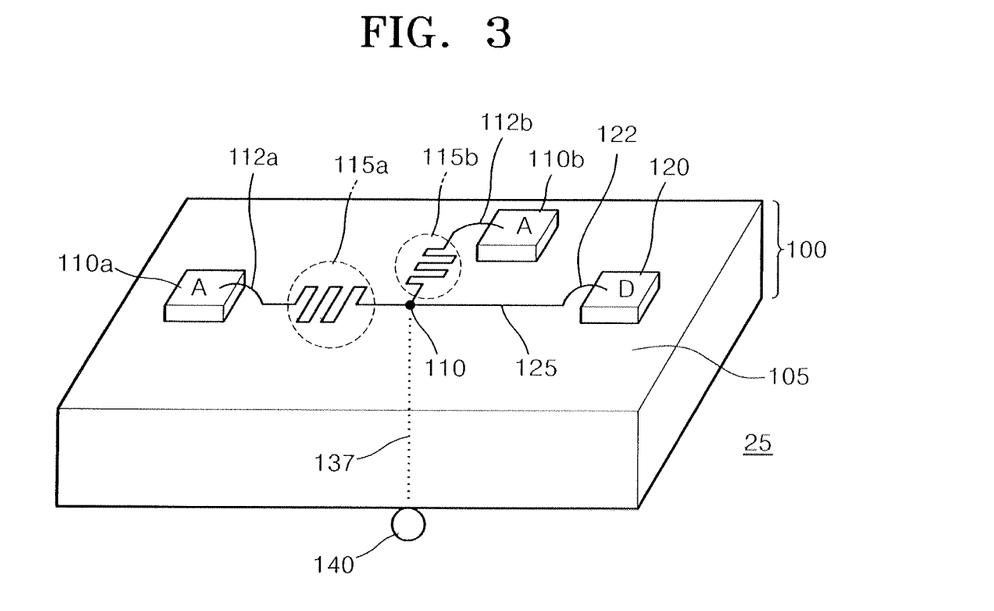
FIG. 3 is a circuit diagram illustrating a semiconductor package according to another embodiment of the general inventive concept.

FIG. 3 is a perspective view illustrating a semiconductor package 25 according to another embodiment of the general inventive concept.

Analog semiconductor chips 110a and 110b and a digital semiconductor chip 120 are mounted on an uppermost layer 105 of a circuit substrate 100, and a chip pad (not shown) of each of the semiconductor chips 110a, 110b, and 120 is electrically connected to a first end portion of first conductive wires 112a and 112b and a second conductive wire 122, respectively.

A second end portion of the first and second conductive wires 112a, 112b, and 122 is electrically connected to an integrated ground 110 via ground impedances, or impedance structures, 115a, 115b, and 125, respectively. The analog ground impedances 115a and 115b which are respectively electrically connected to the first conductive wires 112a and 112b include meandering-type metal wirings formed on the uppermost layer 105 of the circuit substrate 100. The digital ground impedance 125 may comprise the impedance of a connecting wire without an additional impedance-forming structure, or it may include a distinct impedance-forming structure.

The integrated ground 110 may be electrically connected to a package ground ball 140 via a third internal wiring line 137, such as a via hole. The package ground ball 140 is electrically connected to a system board-level ground (not shown) and a chipset-level ground (not shown).

Figure 4:
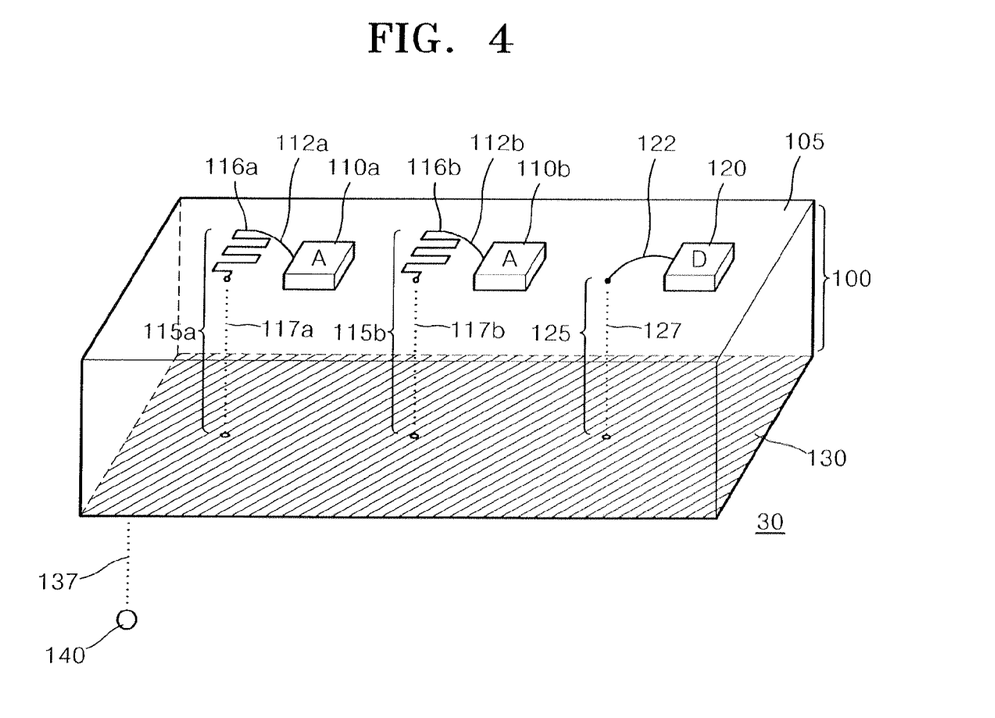
FIG. 4 is a perspective view illustrating a semiconductor package according to another embodiment of the general inventive concept.

FIG. 4 is a perspective view illustrating a semiconductor package 30 according to another embodiment of the general inventive concept.

Analog semiconductor chips 110a and 110b and a digital semiconductor chip 120 may be mounted on an upper most layer 105 of a circuit substrate 100, and a chip pad (not shown) of each of the semiconductor chips 110a, 110b, and 120 is electrically connected to a first end portion of first conductive wires 112a and 112b and a second conductive wire 122, respectively. A second end portion of the first and second conductive wires 112a, 112b, and 122 is electrically connected to an integrated ground layer 130 via ground impedances 115a, 115b, and 125, respectively. The integrated ground layer 130 is electrically connected to a package ground ball 140 via a third internal wiring line 137 such as a via. The package ground ball 140 is electrically connected to a system board-level ground (not shown) and a chipset-level ground (not shown).

Analog ground impedances 115a and 115b are electrically connected to the first conductive wires 112a and 112b, respectively, and include meandering-type metal wirings 116a and 116b that are formed on the uppermost layer 105 of the circuit substrate 100. The metal wirings 116a and 116b are electrically connected to the integrated ground layer 130 via first internal wiring lines 117a and 117b, such as through a via hole. The second conductive wire 122 is electrically connected to the integrated ground layer 130 via a second internal wiring line 127, such as a via hole.

Inductances of the meandering-type metal wirings 116a and 116b are high, and thus a high frequency noise current generated by the digital semiconductor chip 120 flows to the integrated ground layer 130, the third internal wiring line 137, and the package ground ball 140, which may have relatively low inductances. That is, only a small current flows to the analog ground impedances 115a and 115b, inductances of which are relatively high, and thus noise coupling may be prevented although the integrated ground layer 130 is introduced.

The digital ground impedance 125 may also selectively include a metal wiring formed using a wiring pattern to increase inductance thereof such that the inductance of the digital ground impedance 125 is in a predetermined ratio with the inductance of the analog ground impedances 115a and 115b. The inductance of the analog ground impedances 115a and 115b may be designed to be at least twice as great as the inductance of the digital ground impedance 125.

Selectively, the semiconductor chips 110a, 110b, and 120 may be connected to the circuit substrate 100 via solder bumps or gold (Au) stud bumps instead of via conductive wires.

Although not illustrated in FIG. 4, the semiconductor package 30 may have a structure in which the semiconductor chips are stacked. Also, the semiconductor package 30 may be a wafer level package, wherein a wiring layer formed on semiconductor chips of the wafer level package may correspond to the circuit substrate 100.

Figure 5:
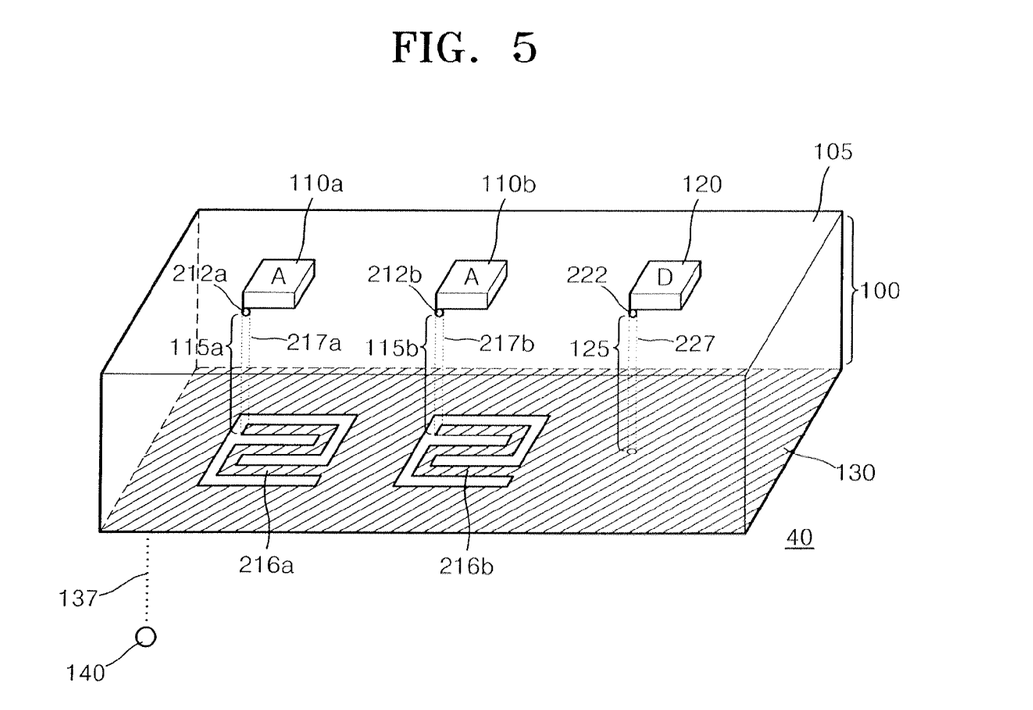
FIG. 5 is a perspective view illustrating a semiconductor package according to another embodiment of the general inventive concept.

FIG. 5 is a perspective view illustrating a semiconductor package 40 according to another embodiment of the general inventive concept.

Analog semiconductor chips 110a and 110b and a digital semiconductor chip 120 are mounted as flip chips on an uppermost layer 105 of a circuit substrate 100, and a chip pad (not shown) of the semiconductor chips 110a, 110b, and 120 may be connected to first solder bumps 212a and 212b and a second solder bump 222, respectively.

Analog ground impedances 115a and 115b are electrically connected to the first solder bumps 212a and 212b, respectively, and may include meandering-type metal wirings 216a and 216b formed on an integrated ground layer 130 of the circuit substrate 100. A first end portion of the metal wirings 216a and 216b is electrically connected to the first solder bumps 212a and 212b, respectively, via first internal wiring lines 217a and 217b, such as a via hole. A second end portion of the metal wirings 216a and 216b is electrically connected to the integrated ground layer 130. The second solder bump 222 is electrically connected to the integrated ground layer 130 via a second internal wiring line 227 such as a via.

Selectively, a digital ground impedance 125 may include metal wirings to increase inductance thereof. The metal wirings may be in any shape, including a meandering shape, a single loop, or a saw-tooth. The metal wirings may be formed on the integrated ground layer 130 of the circuit substrate 100.

An integrated ground layer 130 is electrically connected to a package ground ball 140 via a third internal wiring line 137 such as a via. The package ground ball 140 is electrically connected to a system board-level ground (not shown) and a chipset-level ground (not shown).

Figure 6:
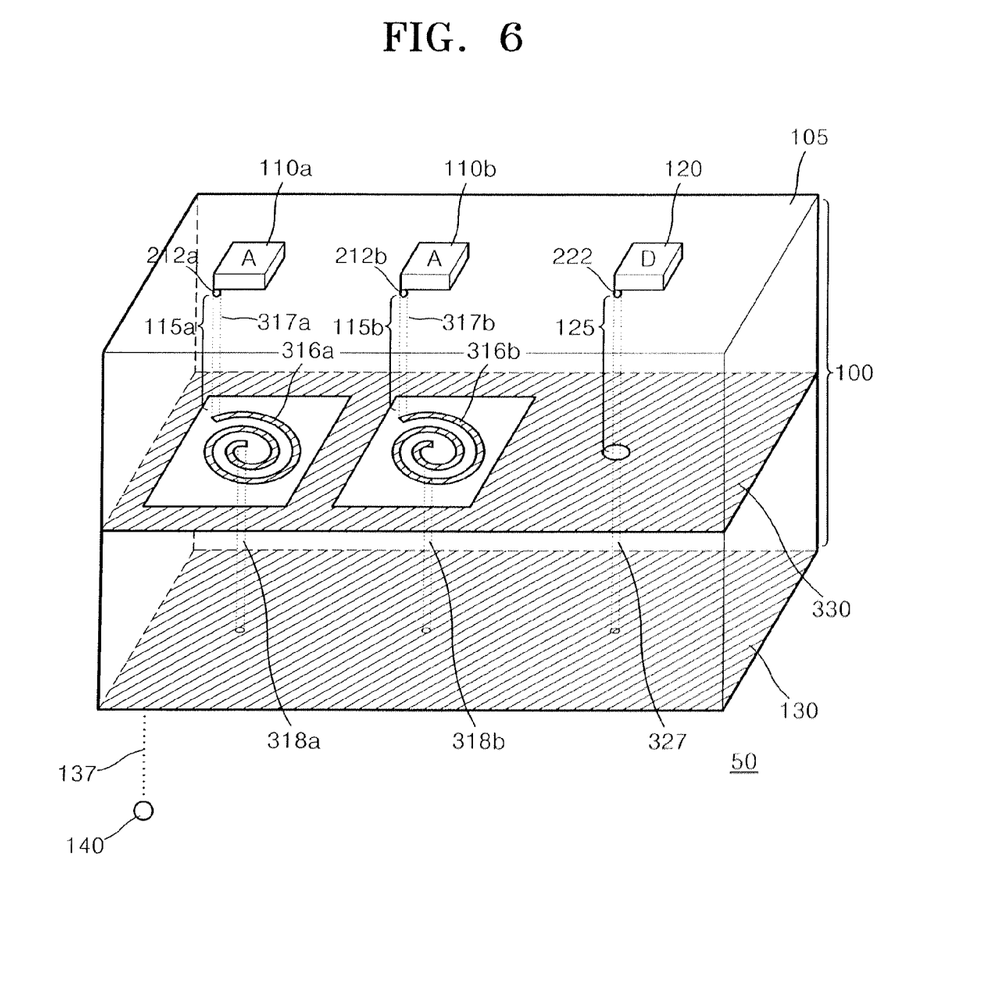
FIG. 6 is a perspective view illustrating a semiconductor package according to another embodiment of the general inventive concept.

FIG. 6 is a perspective view illustrating a semiconductor package 50 according to another embodiment of the general inventive concept.

Analog semiconductor chips 110a and 110b and a digital semiconductor chip 120 are mounted as flip chips on an uppermost layer 105 of a circuit substrate 100, and a chip pad (not shown) of the semiconductor chips 110a, 110b, and 120 is connected to first solder bumps 212a and 212b and a second solder bump 222, respectively.

Analog ground impedances 115a and 115b are electrically connected to the first solder bumps 212a and 212b, respectively, and include spiral metal wirings 316a and 316b formed on an internal layer 330 of the circuit substrate 100. A first end portion of the metal wirings 316a and 316b is electrically connected to the first solder bumps 212a and 212b, respectively, via first internal wiring lines 317a and 317b such as a via. A second end portion of the metal wirings 316a and 316b is electrically connected to an integrated ground layer 130 via fourth internal wiring lines 318a and 318b, respectively, such as a via. The second solder bump 222 is electrically connected to the integrated ground layer 130 via a second internal wiring line 327 such as a via.

An integrated ground layer 130 is electrically connected to a package ground ball 140 via a third internal wiring line 137 such as a via. The package ground ball 140 is electrically connected to a system board-level ground (not shown) and a chipset-level ground (not shown).

A digital ground impedance 125 may include spiral metal wirings to increase inductance thereof. The metal wirings may be formed on the internal layer 330 of the circuit substrate 100.

A spiral metal wiring is concentric in one direction and has a mutual inductance that increases a magnetic field in one direction.

Accordingly, the inductance of the digital ground impedance 125 may be increased by including spiral metal wirings.

Figure 7:
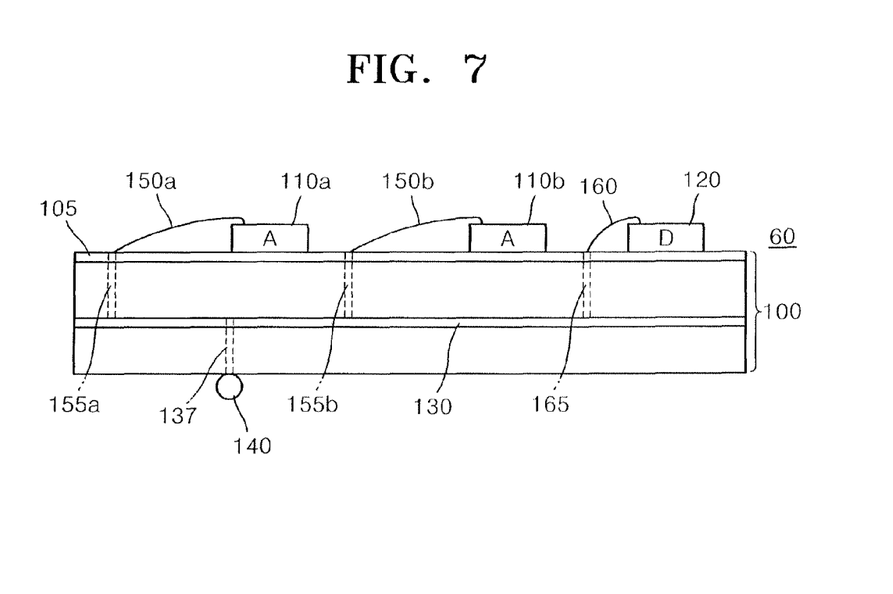
FIG. 7 is a cross-sectional view illustrating a semiconductor package according to another embodiment of the general inventive concept.

FIG. 7 is a cross-sectional view illustrating a semiconductor package 60 according to another embodiment of the general inventive concept.

Analog semiconductor chips 110a and 110b and a digital semiconductor chip 120 are mounted on an uppermost layer 105 of a circuit substrate 100, and a chip pad (not shown) of the semiconductor chips 110a, 110b, and 120 is connected to first conductive wires 150a and 150b and a second conductive wire 160, respectively. The length of the first conductive wires 150a and 150b may be longer than that of the second conductive wires 160.

The longer the length of a conductive wire, the greater a magnetic field in the vicinity thereof, and thus the greater the inductance of the conductive wire becomes. Accordingly, inductances of the first conductive wires 150a and 150b are greater than that of the second conductive wire 160. For example, the inductances of each of the first conductive wires 150a and 150b may be at least twice as great as that of the second conductive wire 160.

The first and second conductive wires 150a, 150b, and 160 are electrically connected to an integrated ground layer 130 via internal wiring lines 155a, 155b, and 165, respectively, such as a via. An integrated ground layer 130 is electrically connected to a package ground ball 140 via a third internal wiring line 137 such as a via. The package ground ball 140 is electrically connected to a system board-level ground (not shown) and a chipset-level ground (not shown).

The first conductive wires 150a and 150b, which have high inductances, and the second conductive wire 160, which has a low inductance, are electrically connected to the integrated ground layer 130, and accordingly, a high frequency noise current from the digital semiconductor chip 120 flows to the integrated ground layer 130, the third internal wiring line 137, and the package ground ball 140, which have low inductances. As only a small current flows to the first conductive wires 150a and 150b, inductances of which are high, noise coupling may be prevented although the integrated ground layer 130 is introduced.

Figure 8:
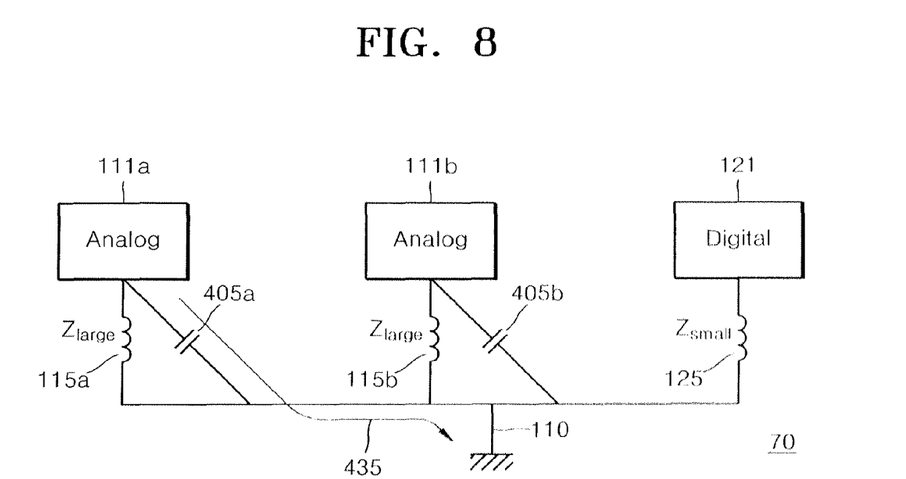
FIG. 8 is a circuit diagram illustrating a semiconductor package according to another embodiment of the general inventive concept.

FIG. 8 is a circuit diagram illustrating a semiconductor package 70 according to another embodiment of the general inventive concept. In FIG. 8, only analog circuit blocks and a digital circuit block are illustrated.

Analog circuit blocks 111a and 111b are connected to an integrated ground 110 via analog ground impedances 115a and 115b, respectively, and a digital circuit block 121 is connected to the integrated ground 110 via a digital ground impedance 125. Capacitors 405a and 405b are electrically connected, respectively, between the analog circuit blocks 111a and 111b and the integrated ground 110.

When a high frequency noise current is generated in the analog circuit blocks 111a and 111b, a current path is formed among the analog circuit blocks 111a and 111b, the digital circuit block 121, and the integrated ground 110. When a high frequency signal is transmitted to the capacitors 405a and 405b, impedance of the capacitors 405a and 405b is reduced. No current flows through a path with relatively high impedance, and thus the high frequency noise current of the analog circuit blocks 111a and 111b is not transmitted to the digital circuit block 121 but flows in a direction 435 to the integrated ground 110 via the capacitors 405a and 405b. That is, the capacitors 405a and 405b function as a kind of high frequency filters that bypass the high frequency noise current.

Figure 9:
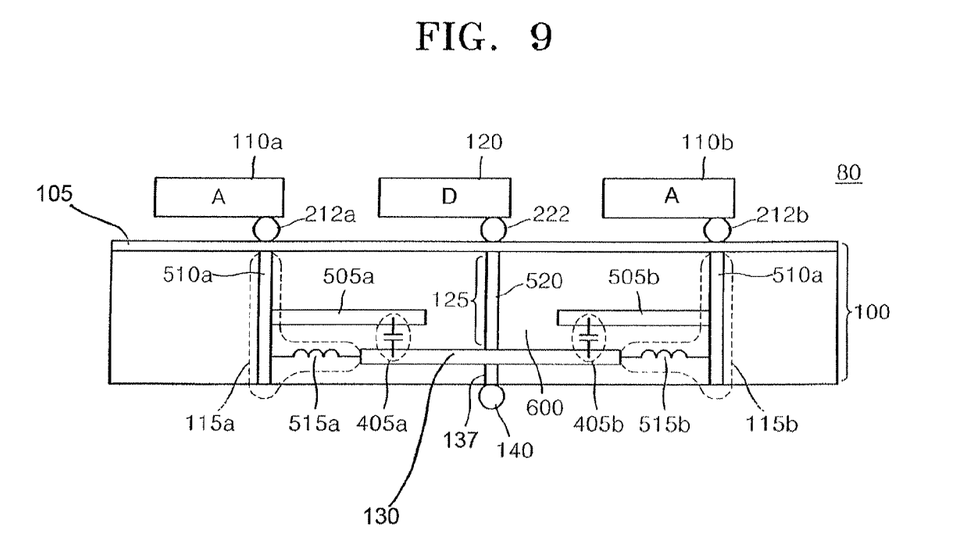
FIG. 9 is a cross-sectional view illustrating a semiconductor package according to another embodiment of the general inventive concept.

FIG. 9 is a cross-sectional view illustrating a semiconductor package 80 according to another embodiment of the general inventive concept.

Analog semiconductor chips 110a and 110b and a digital semiconductor chip 120 are mounted as flip chips on an uppermost layer 105 of a circuit substrate 100, and a chip pad (not shown) of the semiconductor chips 110a, 110b, and 120 is connected to first solder bumps 212a and 212b and a second solder bump 222, respectively.

Analog ground impedances 115a and 115b are electrically connected to the first solder bumps 212a and 212b, respectively, and include metal wirings 515a and 515b formed on an integrated ground layer 130 of the circuit substrate 100. A first end portion of the metal wirings 515a and 515b is electrically connected to the first solder bumps 212a and 212b, respectively, via first internal wiring lines 510a and 510b such as a via. A second end portion of the metal wirings 515a and 515b is electrically connected to the integrated ground layer 130. The second solder bump 222 is electrically connected to the integrated ground layer 130 via a second internal wiring line 520 such as a via.

Upper electrodes 505a and 505b in an internal layer of the circuit board 100 are electrically connected to the first internal wiring lines 510a and 510b. Since an insulation material 600 exists between the integrated ground layer 130 and the upper electrodes 505a and 505b, capacitors 405a and 405b are respectively positioned between the upper electrodes 505a, 505b and the integrated ground layer 130.

The integrated ground layer 130 is electrically connected to a package ground ball 140 via a third internal wiring line 137 such as a via. The package ground ball 140 is electrically connected to a system board-level ground (not shown) and a chipset-level ground (not shown).

The metal wirings 515a and 515b may be metal wirings in the form of a meandering wiring, a single loop, or a saw tooth. A digital ground impedance 125 may include metal wirings in the form of a meandering wire, a single loop, or a saw tooth in order to increase inductance thereof. The metal wirings may be formed on the integrated ground layer 130 of the circuit substrate 100.

Figure 10:
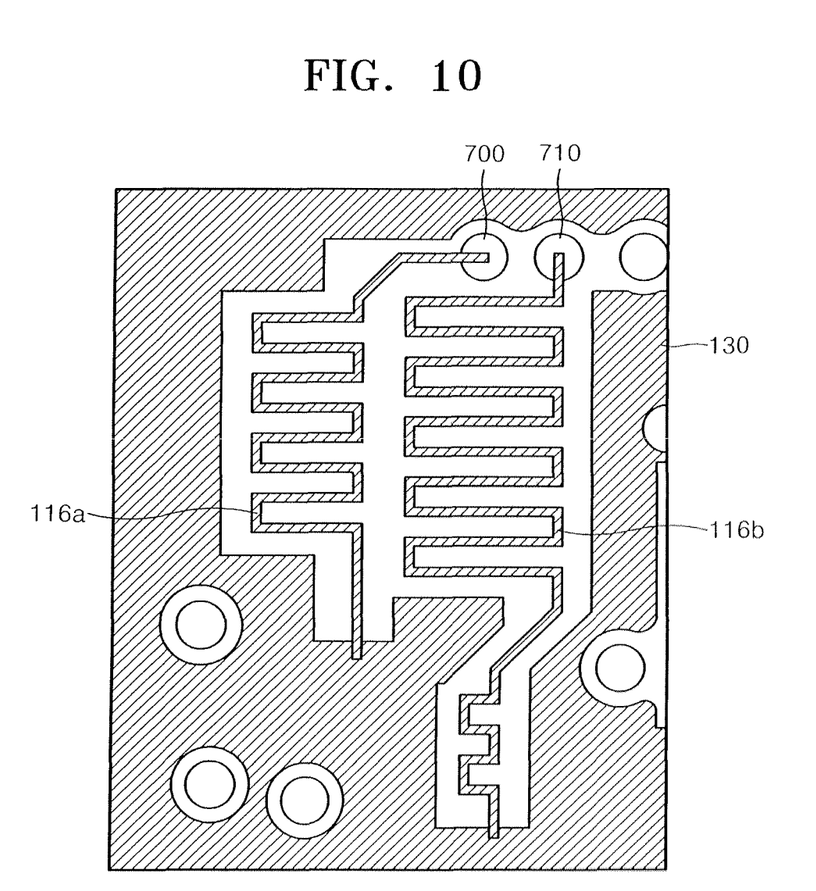
FIGS. 10 and 11 are images showing a semiconductor package in which a ground impedance is formed according to an embodiment of the general inventive concept.

FIG. 10 is an image of an integrated ground layer in which a ground impedance is formed, according to an embodiment of the general inventive concept.

An analog semiconductor chip or an analog circuit block (not shown) may be electrically connected to analog grounds 700 and 710 via a first internal wiring line (not shown) such as a via. The analog grounds 700 and 710 are electrically connected to an integrated ground layer 130 via meandering-type metal wirings 116a and 116b, respectively. The metal wirings 116a and 116b are formed in the integrated ground layer 130 by ground-patterning the integrated ground layer 130.

Figure 11:
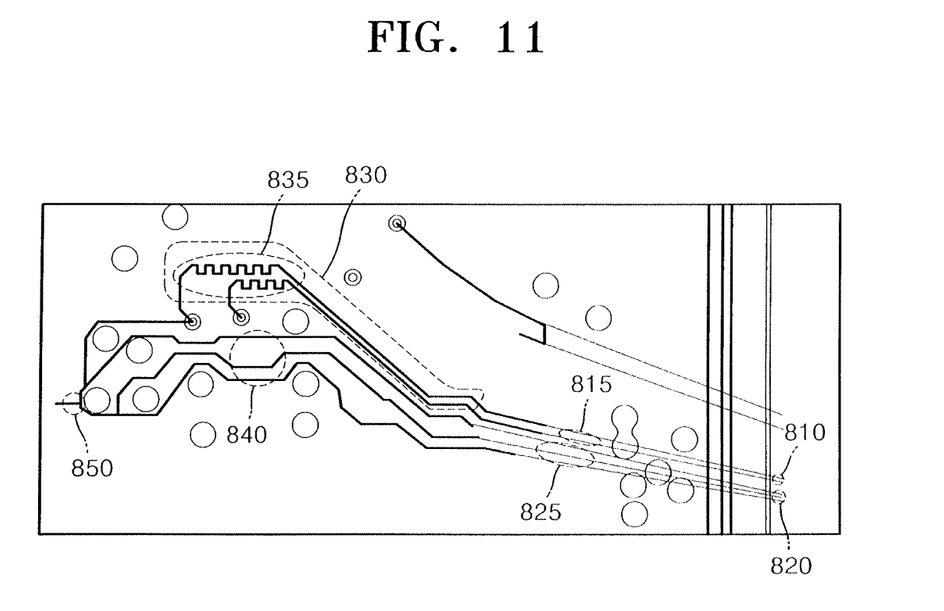

FIG. 11 illustrates a semiconductor package in which a ground impedance is used, according to an embodiment of the general inventive concept.

A semiconductor chip may include an analog ground chip pad 810 and a digital ground chip pad 820. The analog ground chip pad 810 is electrically connected to an analog ground impedance 830 via a first conductive wire 815. The digital ground chip pad 820 is electrically connected to a digital ground impedance 840 via a second conductive wire 825. The analog ground impedance 830 includes a meandering-type metal wiring 835. The analog ground impedance 830 and the digital ground impedance 840 are connected to an integrated ground 850.

Figure 12:
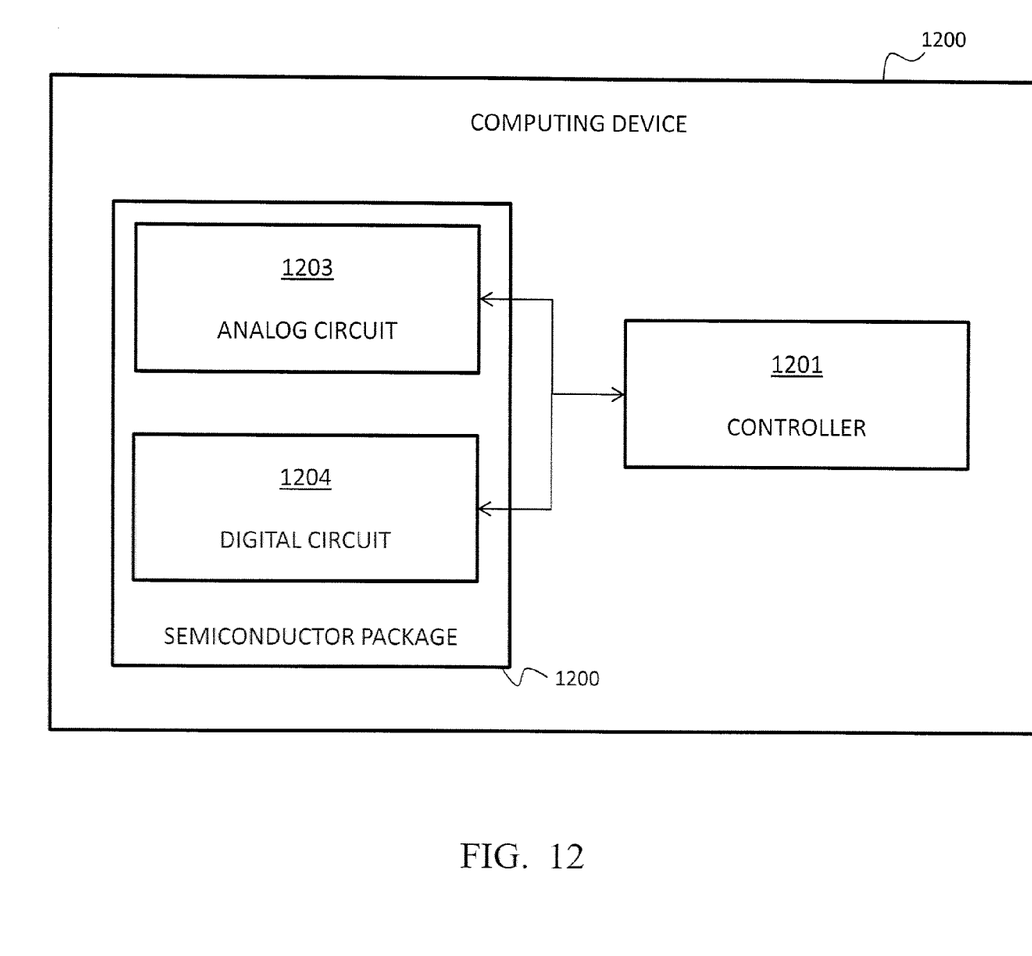
FIG. 12 illustrates a computing device according to an embodiment of the present general inventive concept.

Referring to FIG. 12, a computing device 1200 may include a semiconductor package 1202, which may correspond to any of the above semiconductor packages, and a controller 1201. As discussed above, the semiconductor package 1202 may include both an analog circuit 1203 and a digital circuit 1204, each connected to an integrated ground (not shown). The controller 1201 may interact with an interface (not shown) to transmit and receive commands, data, and/or power to and from the semiconductor package 1202. The interface may be a user-controlled interface, such as a keypad, or a computerized interface, such as another computer or computer connection, or a wireless connection. The interface may be integral with the computing device 1200 or it may be externally connected. The analog circuit 1203 and the digital circuit 1204 may transmit commands, data, and/or power to the controller 1201 or directly to another chip, device, or interface upon the controller's 1201 command.

Elements illustrated in the drawings, which are provided for clear understanding of the general inventive concept, should be regarded as illustrative only. It should be understood that the elements may be modified in various forms other than the illustrated ones.

While the present general inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a digital circuit block and an analog circuit block;
   an integrated ground to provide an equipotential voltage to the digital circuit block and the analog circuit block;
   a digital ground impedance structure that electrically connects the digital circuit block to the integrated ground;
   an analog ground impedance structure that has a greater inductance than the digital ground impedance structure and electrically connects the analog circuit block to the integrated ground; and
   an external terminal connected to the integrated ground, the external terminal to provide a ground potential to both of the digital circuit block and the analog circuit block,
   wherein the analog ground impedance structure has a shape different than the digital ground impedance structure.

2. The semiconductor package of claim 1, wherein an inductance of the analog ground impedance structure is at least twice as great as an inductance of the digital ground impedance structure.

3. The semiconductor package of claim 1, wherein at least one of the analog ground impedance structure and the digital ground impedance structure includes metal wirings in the forms of a meandering shape, a single loop, a saw tooth, or a spiral.

4. The semiconductor package of claim 1, further comprising:
   a multi-layer circuit substrate on which the analog circuit block and the digital circuit block are mounted,
   wherein:
   an integrated ground layer is included in the multi-layer circuit substrate,
   the integrated ground includes an integrated ground layer, and at least one of the analog ground impedance structure and the digital ground impedance structure is formed on a same layer as the integrated ground layer.

5. The semiconductor package of claim 1, further comprising:
at least one capacitor that electrically connects the analog circuit block to the integrated ground.

6. The semiconductor package of claim 5, wherein the at least one capacitor is an embedded thin capacitor.

7. A semiconductor package comprising:
at least one digital semiconductor chip including a first ground chip pad;
at least one analog semiconductor chip including a second ground chip pad;
an integrated ground layer to provide an equipotential voltage to the at least one digital semiconductor chip and the at least one analog semiconductor chip;
a digital ground impedance structure that electrically connects the integrated ground layer to the first ground chip pad;
an analog ground impedance structure that has greater inductance than the digital ground impedance structure and that electrically connects the integrated ground layer to the second ground chip pad; and
an external terminal connected to the integrated ground layer, the external terminal to provide a ground potential to both of the digital semiconductor chip and the analog semiconductor chip,
wherein the analog ground impedance structure has a shape different than the digital ground impedance structure.

8. The semiconductor package of claim 7, further comprising:
a plurality of conductive media that electrically connect the first ground chip pad to the digital ground impedance structure, and the second ground chip pad to the analog ground impedance structure,
wherein at least one of the conductive media is a conductive wire, a solder bump, or a gold (Au) stud bump.

9. A semiconductor package comprising:
at least one digital semiconductor chip including a first ground chip pad;
at least one analog semiconductor chip including a second ground chip pad;
an integrated ground layer to provide an equipotential voltage to the at least one digital semiconductor chip and the at least one analog semiconductor chip;
a first conductive wire that electrically connects the integrated ground layer to the first ground chip pad;
a second conductive wire that has greater inductance than the first conductive wire and electrically connects the integrated ground layer to the second ground chip pad; and
an external terminal connected to the integrated ground layer, the external terminal to provide a ground potential to both of the digital semiconductor chip and the analog semiconductor chip
wherein the first conductive wire is longer than the second conductive wire.

10. The semiconductor package of claim 9, wherein the inductance of the second conductive wire is at least twice as great as the inductance of the first conductive wire.

11. The semiconductor package according to claim 1, wherein:
at least one of the analog impedance structure and the digital impedance structure is located on an upper-most surface of a substrate, and
the integrated ground is located on a surface of the substrate opposite the upper-most surface.

12. The semiconductor package according to claim 11, wherein: each of the analog circuit block and the digital circuit block is connected to the integrated ground by at least one via through the substrate.

13. The semiconductor package according to claim 12, wherein:
the at least one via includes a first via to connect the at least one analog circuit to the integrated ground and a second via to connect the at least one digital circuit block to the integrated ground.

14. The semiconductor package according to claim 12, wherein the analog circuit block and the digital circuit block are both connected to a same via to connect to the integrated ground.

15. The semiconductor package according to claim 12, wherein at least one of the analog impedance structure and the digital impedance structure is located on the upper-most surface between the respective analog circuit block or digital circuit block and the at least one via.

16. The semiconductor package according to claim 12, wherein at least one of the analog impedance structure and the digital impedance structure is located on the surface of the substrate opposite the upper-most surface.

17. The semiconductor package according to claim 12, wherein a distance along an electrical path between the analog circuit block and the integrated ground is greater than a distance along an electrical path between the digital circuit block and the integrated ground.

18. The semiconductor package according to claim 1, wherein:
at least one of the analog circuit block and the digital circuit block is located on an upper-most surface of a substrate;
the integrated ground is located on a surface of the substrate opposite the upper-most surface, and
at least one of the analog impedance structure and the digital impedance structure is located in a layer within the substrate between the upper-most layer and the layer opposite the upper-most layer.

19. The semiconductor package according to claim 1, wherein the analog impedance structure is longer than the digital impedance structure.

20. The semiconductor package according to claim 6, wherein:
each of the analog circuit block and the digital circuit block are located on an upper-most layer of a substrate, and
each of the analog impedance structure, the digital impedance structure, the integrated ground, and the at least one capacitor is embedded within the substrate.

21. A computing device, comprising:
a semiconductor package comprising:
an analog circuit block;
a digital circuit block;
an integrated ground connected to each of the analog circuit block and the digital circuit block;
a first impedance structure located along an electrical path between the digital circuit block and the integrated ground; and
a second impedance structure located along an electrical path between the analog circuit block and the integrated ground, the second impedance structure having an inductance greater than the first impedance structure;
a controller to control operation of the analog circuit block and the digital circuit block; and an external terminal connected to the integrated ground, the external terminal to provide a ground potential to both of the digital circuit block and the analog circuit block, wherein the first impedance structure has a shape different than the second impedance structure.

* * * * *